(12) United States Patent
Ikura et al.

(10) Patent No.: US 6,528,898 B1
(45) Date of Patent: Mar. 4, 2003

(54) PYROELECTRIC CONVERSION SYSTEM

(75) Inventors: Michio Ikura, Kanata (CA); Robert Charbonneau, Orleans (CA)

(73) Assignee: Her Majesty the Queen in right of Canada, as represented by the Minister of Natural Resources, Ottawa (CA)

( * ) Notice: Subject to any disclaimer, the term of this patent is extended or adjusted under 35 U.S.C. 154(b) by 0 days.

(21) Appl. No.: 09/856,480

(22) PCT Filed: Dec. 14, 1998

(86) PCT No.: PCT/CA98/01170

§ 371 (c)(1),
(2), (4) Date: Jul. 23, 2001

(87) PCT Pub. No.: WO00/36656

PCT Pub. Date: Jun. 22, 2000

(51) Int. Cl.$^7$ .................................................. H02P 9/04
(52) U.S. Cl. ...................................... 290/1 R; 310/306
(58) Field of Search ........................ 290/1 R; 310/306, 310/308

(56) References Cited

U.S. PATENT DOCUMENTS

| | | | | |
|---|---|---|---|---|
| 2,635,431 A | * | 4/1953 | Bichowsky | 204/263 |
| 3,243,687 A | * | 3/1966 | Hoh | 136/213 |
| 3,610,970 A | * | 10/1971 | Skinner | 310/10 |
| 3,737,688 A | * | 6/1973 | O'Hare | 310/10 |
| 3,899,359 A | * | 8/1975 | Stachurski | 136/205 |
| 3,971,938 A | * | 7/1976 | O'Hare | 136/254 |
| 4,074,129 A | * | 2/1978 | O'Hare | 136/254 |
| 4,087,735 A | * | 5/1978 | O'Hare | 250/214.1 |
| 4,220,906 A | | 9/1980 | Drummond | |
| 4,425,540 A | | 1/1984 | Olsen | |
| 4,441,067 A | | 4/1984 | O'Hare | |
| 4,620,262 A | | 10/1986 | Olsen | |
| 4,647,836 A | | 3/1987 | Olsen | |
| 4,885,783 A | * | 12/1989 | Whitehead et al. | 381/191 |
| 5,644,184 A | * | 7/1997 | Kucherov | 310/306 |

OTHER PUBLICATIONS

R. B. Olsen and D. D. Brown, "High Efficiency Direct Conversion of Heat to Electrical Energy–Related Pyroelectric Measurements," Ferroelectrics, 1982, vol. 410, pp. 17–27.

Randall B. Olsen, "A Pyroelectric Energy Covertor Which Employs Regeneration," Ferroelectrics, 1981, vol. 38, pp. 975–978.

Randall B. Olsen, "Pyroelectric Converstion Cycle of Vinylidene Fluoride–Trifluoroethylene Copolyer," J. Appl. Phys. 57 (11), Jun. 1, 1985.

* cited by examiner

Primary Examiner—Joseph Waks
(74) Attorney, Agent, or Firm—Jones, Tullar & Cooper, P.C.

(57) ABSTRACT

When the temperature of pyroelectric film is increased from low to high near its phase transition temperature its ability to hold electrical charge on its surfaces diminishes, and the charge can be drawn as current through an external load resistor. Once the film temperature reaches a steady temperature, no more power can be drawn. However, if the film temperature is lowered again, it will restore charge on the film surfaces and the pyroelectric conversion process can be repeated. Because pyroelectric conversion depends on the degree of temperature change and the repetition rate of the process, the faster the cycling the more power it can generate by converting heat to electric power. An improved apparatus and method is disclosed for converting heat to electrical energy with a multi-layer stack of thin pyroelectric films. The pyroelectric film surface is cycled between higher and lower temperatures by the displacement of higher and lower temperature fluid over the film surface. The system alternates hot and cold fluid without reversing direction of the fluids over the films to achieve rapid thermal cycling with this uni-directional fluid flow. A novel voltage controller slave to a magnetic proximity switch mounted on a rotating flow controller, provides synchronization of the thermal and electric cycling of the pyroelectric films.

15 Claims, 9 Drawing Sheets

Step 1: <u>Heating and Cooling of the Films</u>

Step 2: <u>Voltage Reduction</u>

Step 3-A: Voltage Measurements

Step 3-B: Open Relays

Step 3-C: Close Some Relays

Step 4:  Voltage Increase

PYROELECTRIC CONVERSION SYSTEM

TECHNICAL FIELD

This invention relates to improvements in the conversion of heat to electric energy, more particularly to the use of stacked layers of thin pyroelectric films with means for alternatingly delivering hot and cold fluids to the films. A novel voltage controller slave to a magnetic proximity switch mounted on a rotating flow controller, provides a synchronization of the thermal and electrical cycling of the pyroelectric converter.

BACKGROUND ART

The use of capacitors with temperature dependent dielectrics in pyroelectric systems is taught in U.S. Pat. No. 4,220,906, issued Sep. 2, 1980 to Drummond and U.S. Pat. No. 4,441,067, issued Apr. 3, 1984 to O'Hara. Both patents identify the suitability of such systems for operation with waste heat from industries such as at pulp and paper mills, steel works, petrochemical plants, glass manufacturers, and electric power stations.

Unfortunately when thermal efficiency is increased by extracting more heat from the waste heat, the cost of installing additional equipment for extra heat utilization often becomes prohibitive. Also, technical difficulties arise when extracting a large amount of heat from a process; when a system for highly efficient heat recovery from waste gases is planned, the condensation of acidic liquids and subsequent equipment corrosion become a serious technical hurdle to implementing waste heat utilization schemes. Further, when heat source temperature is low the available heat for further useful work becomes limited, being limited by Carnot cycle efficiency.

A pyroelectric film can function as a temperature-dependent capacitor; when heat is applied and its temperature increases, its capacitance (ability to store charge) diminishes. When the film temperature is raised charge can no longer remain on the surfaces of the film and is forced to leave, giving out electrical energy. Thus heat input is converted to electrical charge.

The present invention uses a pyroelectric conversion cycle discussed in Olsen, R. B., Brisco, J. M. Bruno, D. A. and Butler, W. F., "A pyroelectric energy converter which employs regeneration", Ferroelectrics, vol. 38, pp. 975–978 (1981) and in Olsen, R. B., Bruno, D. A. and Brisco, J. M., "Pyroelectric conversion cycle of vinylidene fluoride-trifloroethylene copolymer", J. Appl. Phys. 57(11), pp 5036–5042 (1985).

U.S. Pat. No. 4,425,540, issued Jan. 10, 1987, and U.S. Pat. No. 4,647,836, issued Mar. 3, 1987, both to Olsen, disclose the same power cycle that can be used to convert waste heat to electricity directly, hereinafter referred to as the Olsen cycle. The thermal response of pyroelectric films is synchronized with externally controlled bias voltage in order to convert heat energy to electrical energy. This Olsen cycle parallels a heat engine.

Ferroelectric materials such as PZST (sintered ceramic of lead zirconate, lead titanate and lead stannate) and P(VDF-TrFE) (copolymers of vinylidene fluoride-trifluoroethylene) are suitable for pyroelectric conversion (U.S. Pat. No. 4,620, 262, October 1986). Many monomers contain polar groups. To yield useful piezoelectric and also pyroelectric polymers, their constituents should not be so bulky as to prevent crystallization of the macromolecules or to force them into shapes (such as helical) that result in extensive internal compensation of polarization. The fluorine atom is very small, its van der Waals radius (1.35 Å) being only slightly larger than that of hydrogen (1.2 Å), and it forms highly polar bonds with carbon, having dipole moment $6.4 \times 10^{-30}$ Coulomb-meter (=1.92 debye). Common resulting polyfluorocarbons are polyvinylidene fluoride ($PVF_2$), poly vinyl fluoride (PVF) and polytrifluoroethylene ($PF_3D$). Other polar groups that could produce useful piezoelectric and pyroelectric polymers include C—Cl bond with 2.1 debye, C—CN bond with 3.86 debye, and C=O—H—N containing a highly polar hydrogen bond at 3.59 debye. When $PVF_2$ is cooled it forms a number of crystallized phases. However, without a poling process the fluorine atoms take largely at trans and gauche positions, thus overall polarity remains neutral. The most useful phase is known as β-phase in $PVF_2$ can be increased by applying external electric field on a stretched $PVF_2$ film.

Copolymers of vinylidene fluoride and trifluorethylene $P(VF_2\text{-TrFE})$ have particularly useful property. They commonly contain 20 to 30 mol TrFE. When they are cooled from melting temperatures to room temperature, they form a β-like phase without stretching the polymers. This is because trifloroethylene $(CF_2\text{—}CHF)_n$ contains a greater proportion of the comparatively bulky fluorine atoms than $PVF_2$, their molecular chains cannot accommodate the $tg^+tg^-$ conformation and are therefore forced to crystallize directly with the more extended all-trans conformation. Further, the TrFE in the $P(VF_2\text{-TrFE})$ chain appears to stabilize the "trans" form to the degree just suitable for the conformational change when exposed to reverse external field.

$P(\text{TrFE-VF}_2)$ copolymers from 12.5 to 85 mol % $VF_2$ always show the β-phase crystal (trans or trans-like conformation), and do not transform into the non-polar α-phase by any thermal treatments. Particularly those between 65 and 80 mol % $VF_2$ spontaneously crystallize into all-trans β-structure (ferroelectric) with a high degree of crystallinity without the need for drawing. They undergo a ferroelectric phase transition at a Curie temperature from 60° C. to 140° C. with increasing $VF_2$ content.

The major process parameters determining the power output from a pyroelectric film are the volumetric resistivity of the pyroelectric material, the temperature dependency of the pyroelectric coefficient of a given film, the span of temperature cycling (the span of high and low film temperatures), the width of operating voltages (the difference between $V_{high}$ and $V_{low}$) and the frequency of the Olsen cycle.

U.S. Pat. No. 4,647,836 shows that the overall system efficiency of pyroelectric conversion increases with the use of a heat regeneration technique, see also Olsen, R. B. and Brown, D. D., "High efficiency direct conversion of heat to electrical energy-related pyroelectric measurements", Ferroelectrics, vol. 40, pp. 17–27 (1982). One of the important parameters that influences overall system efficiency is the regeneration of usable heat. It is critically important to convert as much heat as possible to electricity before heat degrades to an unusable state. Heat regeneration allows this. When pyroelectric films receive heat from heating fluid at a higher temperature, their temperature rises. Thus they themselves become a heat source with respect to fluid at a lower temperature. When this sequence is repeated a given amount of heat can be shuttled many times via the pyroelectric film assemblies between heat source and heat sink temperatures before the heat eventually degrades and the heat shuttling becomes impossible. Previous designs were bulky as well as unsuitable for rapid thermal cycling due to the reciprocal motion of heat transfer fluids in heat exchangers housing pyroelectric films.

DISCLOSURE OF INVENTION

The present invention provides an improved apparatus and method for converting heat to electrical energy with a multi-layered stack of thin pyroelectric films which overcome problems with prior bulky designs. The pyroelectric film surface is cycled between higher and lower temperatures by the displacement of higher and lower temperature fluid over the film surface. The design according to the invention alternates hot and cold fluid without reversing direction of the fluids over the films. Rapid thermal cycling is achieved with this uni-directional fluid flow. A novel voltage controller slave to a magnetic proximity switch mounted on a rotating flow controller, provides a synchronization of the thermal and electric cycling of the pyroelectric films.

BEST MODE FOR CARRYING OUT THE INVENTION

Figure 1:
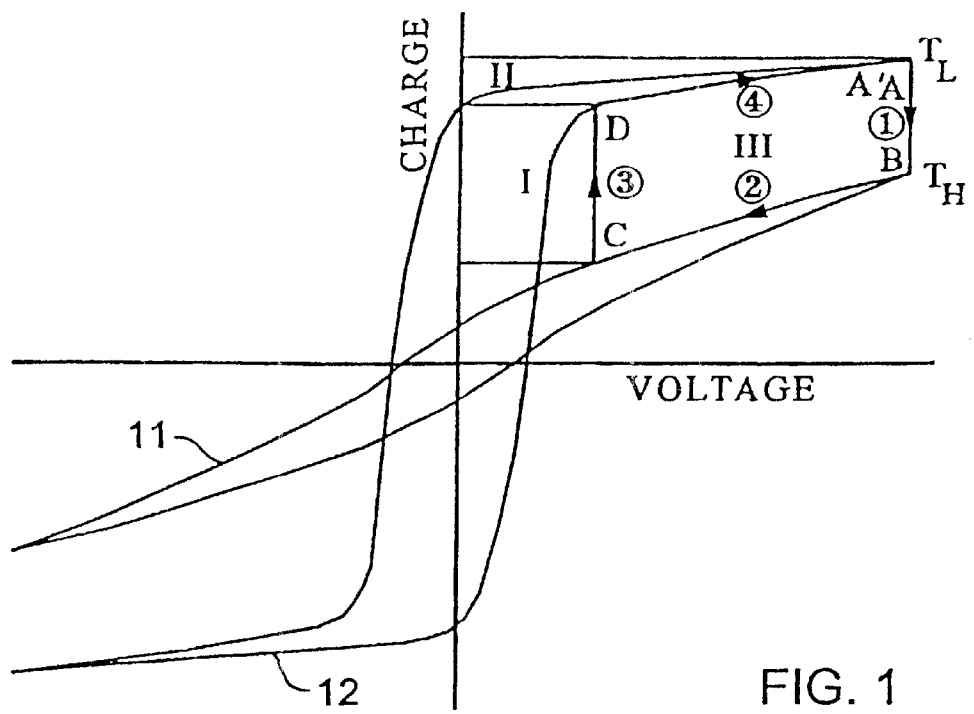
FIG. 1 shows hysteresis loops for pyroelectric material at two different temperatures.

FIG. 1 illustrates how power output can be obtained from the Olsen cycle. Curve 11 is the charge-voltage relationship at high temperatures and curve 12 is the charge-voltage relationship at low temperatures. The different curves illustrate changes of important process parameters as the cycle is performed. The numbers (1) through (4) correspond to the four steps in pyroelectric generation.

Shaded area I represents the energy needed to recharge the film at low voltage during cooling steps (3) of the cycle. As the film cools at low voltage, the charge on its surfaces increases due to the intrinsic properties of the material. Further, recharging is achieved by increasing voltage (step (4). The energy demand of this last step is represented by shaded area II. When the cycle is properly performed, the electrical energy indicated by area III is the net discharge by the film.

The invention utilizes an assembly of stacked pyroelectric films. This takes advantage of fast heat transfer of stacked ultra-thin films to make equipment compact. A complete assembly is suitable for attaining a rapid thermal response and large electrical output from a given heat transfer area in a given time period.

Figure 2:
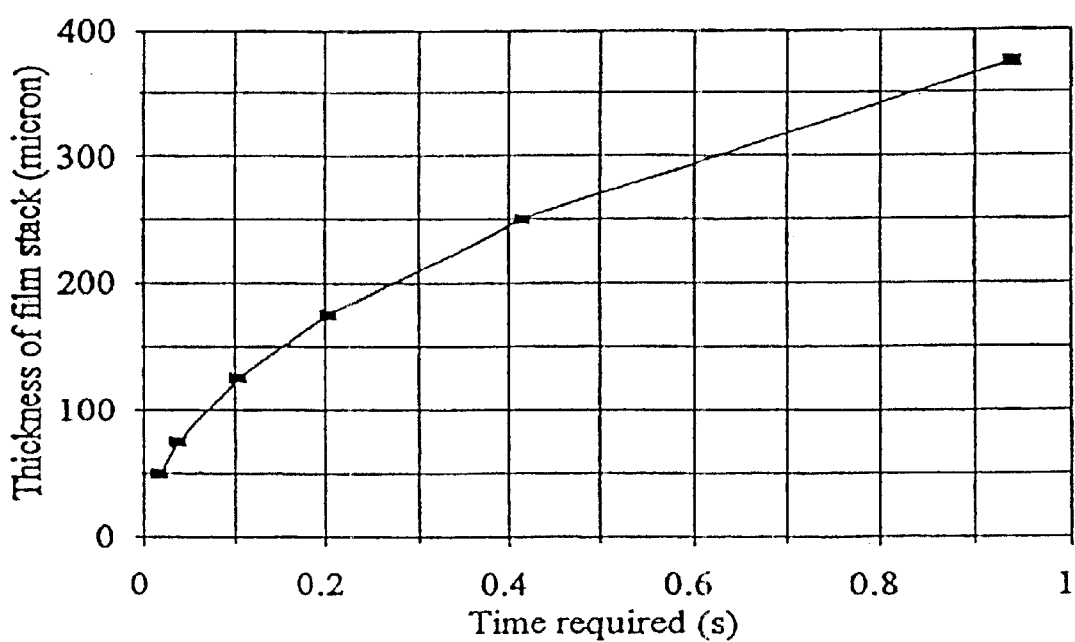
FIG. 2 shows the thermal response time of a copolymer to a step change in temperature.

FIG. 2 shows the thermal response for the copolymer of P(VDF-TrFE) when a film is exposed to a step change in temperature from both sides of the film surfaces. This figure illustrates a relationship between the thickness of the stacked films and time required to reach 95% of the equilibrium temperature at the centre of the film stack. For instance, if the total thickness of the stacked films is 250 microns, it takes only 0.4 s (400 ms) for the temperature at the centre to reach 95% of the final temperature. If the total thickness of the film is kept less than 370 micron, then the response time of less than 1 s can be achieved. If a film thickness of 25 micron is assumed, nearly 15 films can be stacked without losing the rapid thermal response.

It has been found that a conversion efficiency several magnitudes larger than earlier theoretical analysis is possible if external voltage is used to control charging of pyroelectric films at low temperature and low voltage, and discharging them at high temperature and high voltage. In addition, a heat "regeneration" technique is used to increase the heat utilization efficiency. According to this technique, heat rejected in the first pyroelectric element is used to heat the second pyroelectric element and the subsequent elements in a cascading manner. For example, if the heat source is at 70° C. and the heat sink at 30° C. and pyroelectric elements inserted between the two temperatures operated at increments of 10° C. swings: 70 to 60, 60 to 50, 50 to 40 and 40 to 30° C., cooling water (heat sink) temperature correspondingly increase from 30° C. to 40° C., 40° C. to 50° C., 50° C. to 60° C. Thus although the pyroelectric elements experience an overall temperature change from 70° C. to 40° C., overall heat degeneration corresponds to only 70° C. to 60° C., as the final cooling water exiting temperature reaches 60° C. and can substitute as slightly degraded heat source.

This particular structures of this invention has the advantage of delivering heat transfer fluid to the pyroelectric films without reversing the direction of hot and cold fluid. The system of this invention uses the alternating flow of hot and cold water over the stacks of pyroelectric films. As the hot water flows over the surface of a stack of pyroelectric films, the film temperature rises. Subsequently, when hot water is shut off and the system switched to cold water, it cools the films and at the same time it receives heat from the films. When this sequence is repeated, pyroelectric films act as heat shuttling media by receiving and giving heat between hot and cold water flows.

The films according to the invention may be stacked back-to-back eliminating the need for electrical insulation between the films. Stacking an even number of pyroelectric films back-to-back also allows the voltage of pyroelectric film surfaces facing outside to be low.

Figure 3:
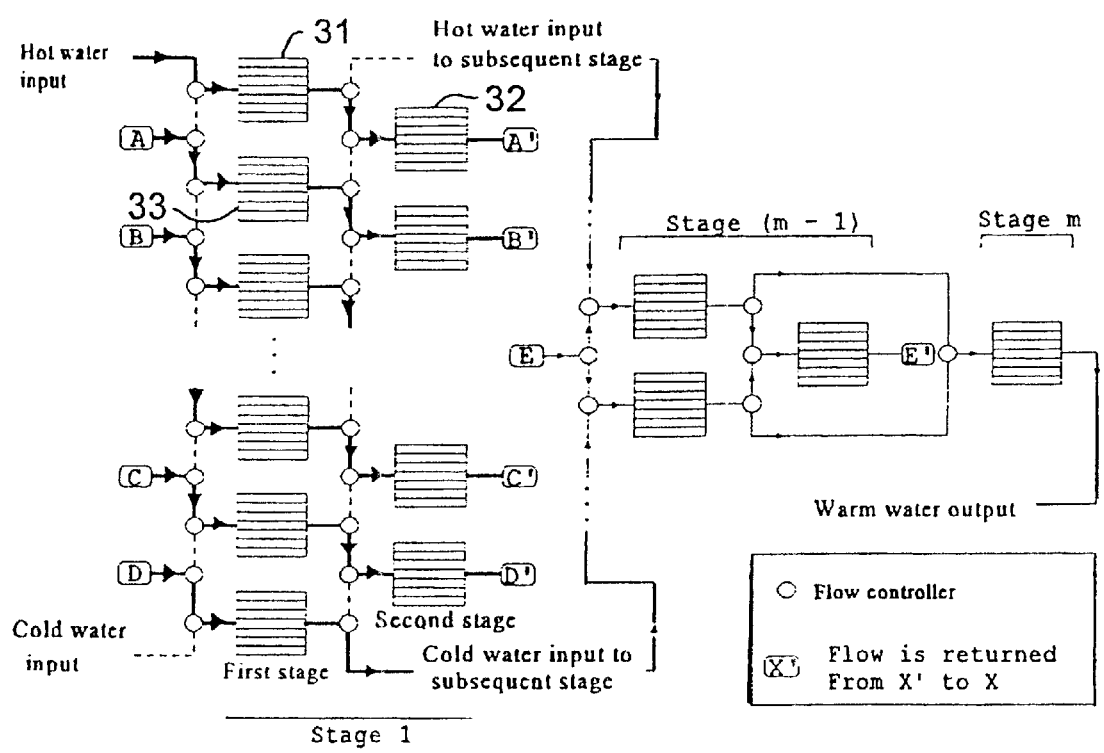
FIGS. 3 and 4 illustrate the structure of the pyroelectric generator of this invention.

FIG. 3 illustrates the structure of a stationary plate generator of this invention. Solid lines indicate "flow" condition and dotted lines "no flow" condition. As shown in this figure, each stage consists of a first set 31 on the left column and a second set 32 on the right column. In addition, each set (column) consists of many plate generator units; numbered as first, second, third, etc. from the top of the column. In a complete system as the stage number increases, the number of plate generator units is decreased up to a last stage having only one remaining generator unit.

In the stationary mode of operation, the system operation is divided into two half periods. In the first half period, the correct amount of hot water fills the first unit 31 of the set of Stage 1. Warm water that was previously in this unit is pushed over to the first unit 32 of the second set of Stage 1. The less warm fluid that was in this unit is further pushed down to the second unit 33 of the first set in Stage 1.

The process repeats until the cold water in the last unit of the first set in Stage 1 is pushed over to Stage 2 as the heat sink. This is possible because there is a temperature distribution from the first unit at the top of the first set (column)

to the last unit at the bottom of the first set. The hot water that enters Stage 1 leaves as cold, and is now useful as a heat sink fluid in Stage 2. It should also be noted that when Stage 1 is in a hot water cycle, Stage 2 is in a cold water cycle.

Figure 4:
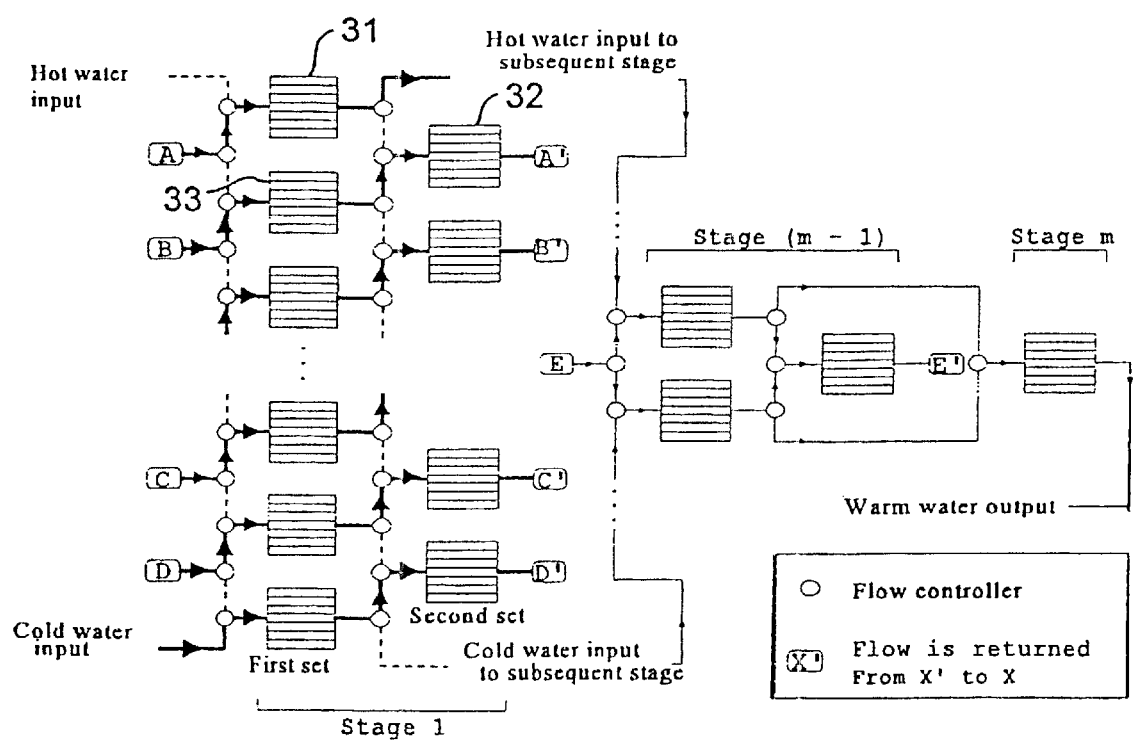

FIG. 4 illustrates the second half period. After the first half period, temperatures in all units in Stage 1 have increased by half a span of a designed temperature cycling. In the second half period the flow to Stage 1 is switched to cold water flow. The switching stops all downward flow of a heat sink and reverses the flow with upward flow of the heat sink. In this configuration, although the heat source and heat sink are alternates, the direction of flow in a given unit remains the same. Thus, the fluid inside the unit is displaced by incoming fluid.

When two half periods are combined, a feature of the system configuration is that, although neither flow travels fully from the top of the set to the bottom of the set, simultaneous temperature cycling occurs in all units. This is because the pyroelectric film assemblies are acting as a shuttle of heat sink and heat source without physically moving their position.

In a preferred embodiment two of these systems may be used so that there will be no interruption of hot and cold water flows at any time; this is advantageous in preventing a loss of energy by a momentum change of on-off cycles. The generator units shown in FIGS. 3 and 4 do not have to be physically independent units; they can be separate film assemblies. They must have a sufficient degree of segregation from adjacent film assemblies in terms of containing the heat transfer fluid and corresponding separate electrical connections.

Figure 5:
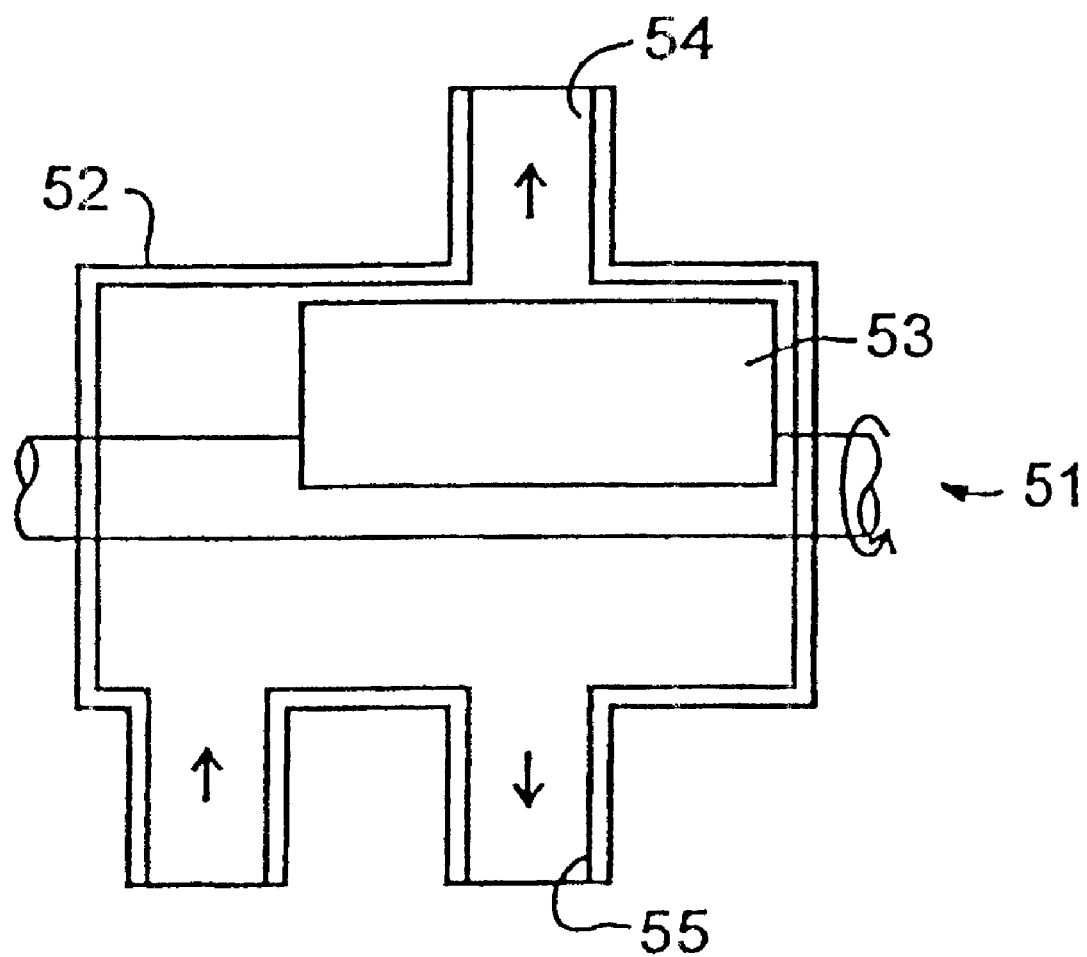
FIG. 5 shows a flow controller useful with the apparatus of FIGS. 3 and 4.
Figure 6:
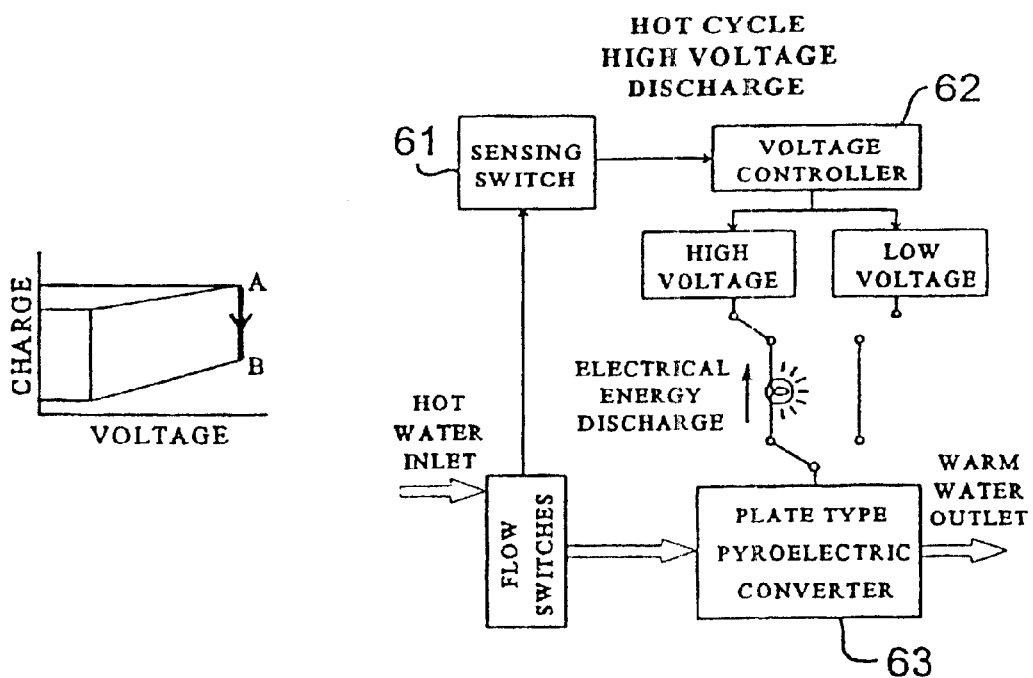
FIGS. 6 to 9 illustrate the operation of the pyroelectric generator to obtain synchronism between the thermal and electrical cycles.
Figure 7:
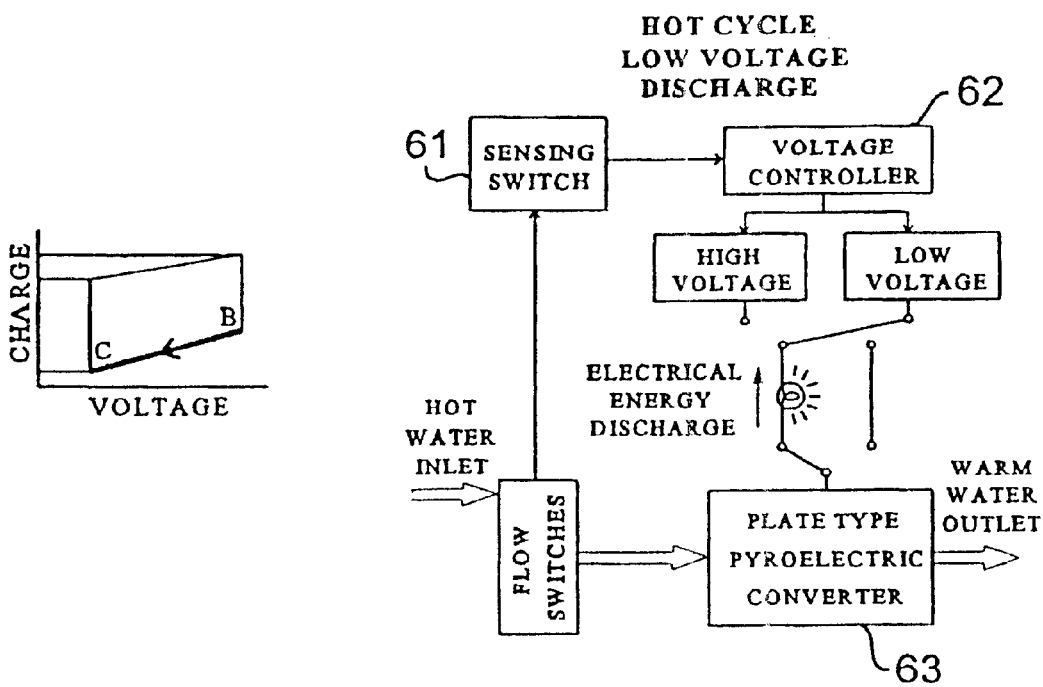
Figure 8:
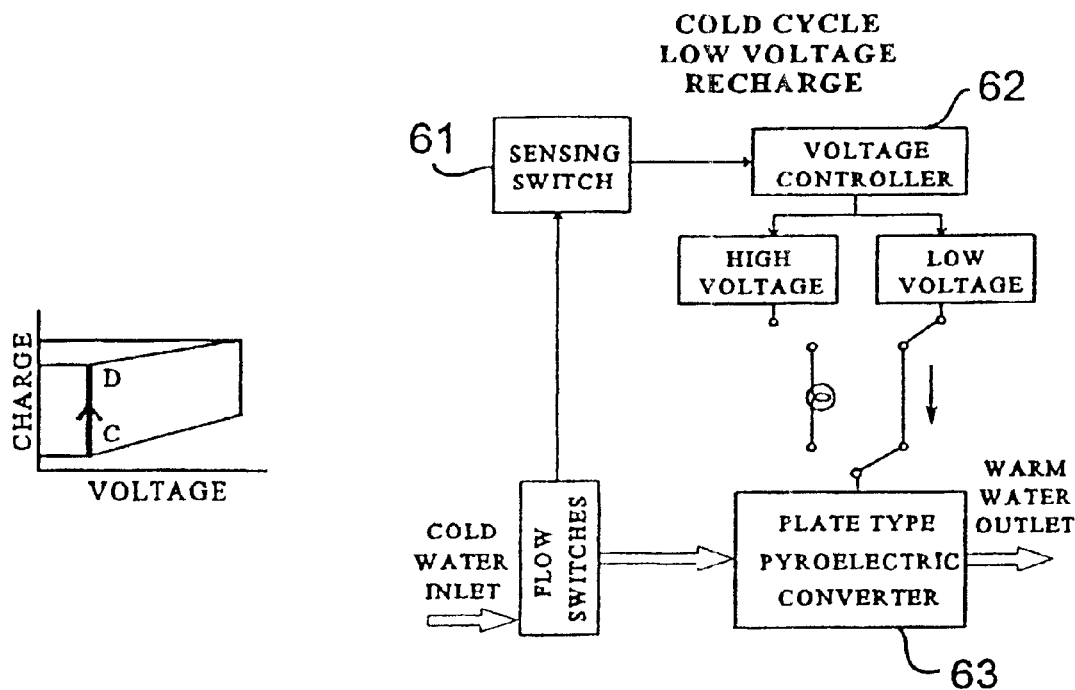
Figure 9:
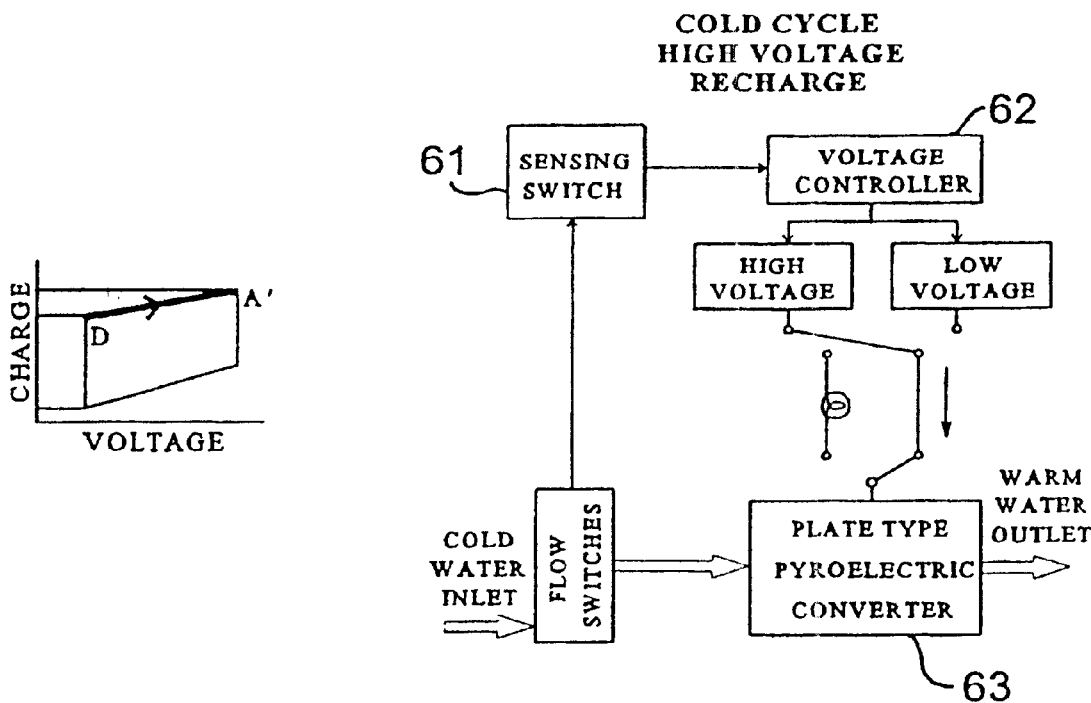

The switching and synchronization of the flow are controlled by a synchronization switch 51 (or high speed water flow controller) shown in FIG. 5, constructed from a tube 52 to which three pipes are connected. A solid half-cylinder 53 rotates in the tube, alternately blocking outlet 54 or 55. For the first half of the period, the water exits from outlet 54 and for the second half of the period, the water exits from outlet 55. A magnetic proximity switch is attached to the rotating shaft which sends electric signals to synchronize the operation of electric circuits for the Olsen cycle.

The operation of the pyroelectric generator can be divided into four steps that correspond to the Olsen cycle, this is illustrated in FIGS. 6 to 9. During the first half of the power generation cycle, hot water enters the plate-type pyroelectric converter 63. Thermal energy from the hot water flowing over the films is absorbed and converted to electrical energy. The electrical energy is discharged at high voltage through a resistive load to perform useful work. This step corresponds with A-B of FIG. 6. A magnetic proximity switch 61 is used along with a voltage controller 62 to ensure that the thermal and electrical cycling of the films is synchronized.

Once the temperature of the films has sufficiently increased, the voltage applied across them is reduced, allowing the hot films to further discharge. This step corresponds with B-C of FIG. 7.

During the second half of the conversion cycle, cold water enters the converter. The films that had been heated during the first half of the cycle are repolarized as they are cooled at low voltage. This step corresponds with C-D of FIG. 8.

The voltage of the cold films is then increased in preparation for the next cycle. This step corresponds with D-A of FIG. 9.

As previously stated, an external control voltage is needed to perform the Olsen cycle. However, if the Olsen cycle is properly performed, the electrical energy output from the films is always greater than the electrical energy input. In order to achieve proper thermal and electrical cycling of pyroelectric films, the voltage controller 62 is necessary for the efficient and safe operation of a pyroelectric converter.

A description of a method of controlling the electrical cycling of two sets of films that are thermally cycled half a period out of synchronization using one variable high-voltage source and one lower constant voltage source is now set out. Cycling two sets of films half a period out of synchronization allows a more regular electrical energy output. Steps 1 to 4 describe the first half cycle and Steps 5 to 8 describe the second half cycle. Referring now to FIGS. 10–13.

Figure 10:
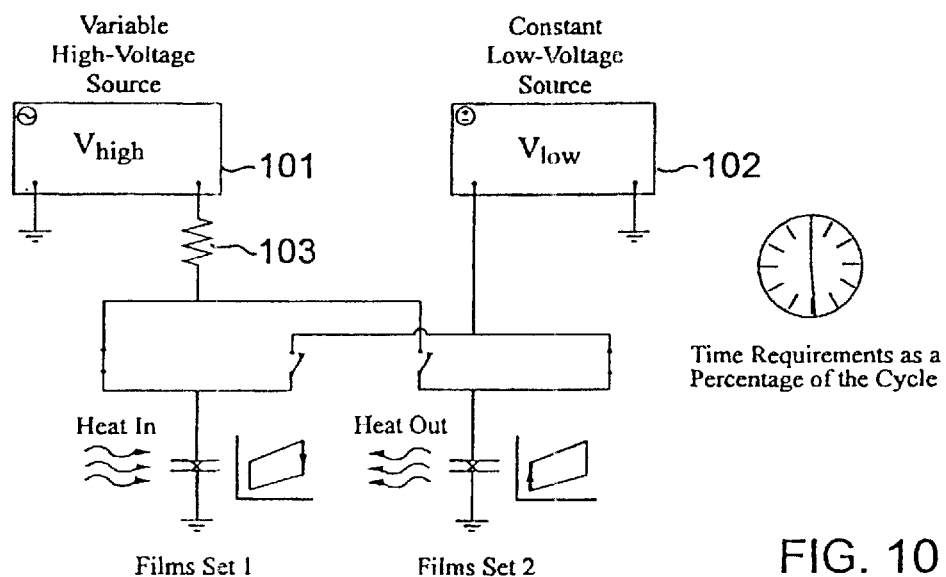
FIGS. 10 to 15 illustrate the sequences of voltage control steps necessary for operation of the pyroelectric generator.

Step 1: Heating and Cooling of the Films (FIG. 10)

The first set of films discharges electricity as it is heated under externally applied high voltage. This electricity performs useful work as it powers a high-voltage resistive load 103. The second set of films is recharged as it is cooled. Recharge energy is supplied by the constant low-voltage source. Connections are made such that the recharge energy is not dissipated through the resistive load 103, except, of course, for that of the internal resistance of the source. This step, lasting almost half the cycle, is slow because it proceeds with film temperature change.

Figure 11:
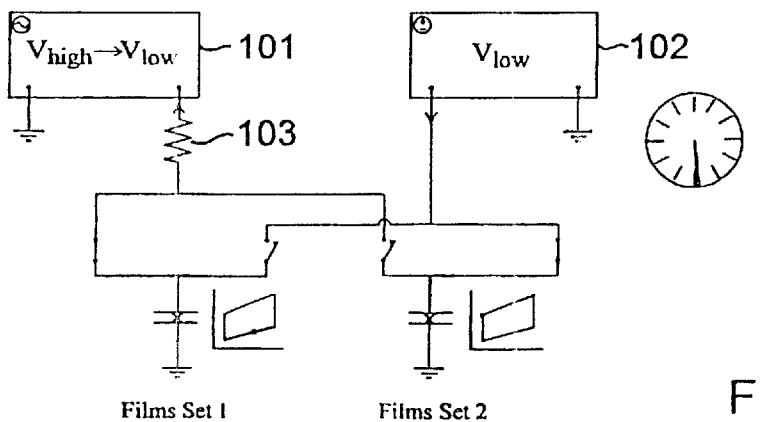

Step 2: Voltage Reduction (FIG. 11)

After the first set of films has had sufficient time to warm up, a magnetic proximity switch triggers the voltage controller, which in turn signals the variable high-voltage source 101 to reduce its voltage. This allows the first set of films to discharge further. This step may be done very rapidly and the films' temperature does not change significantly during the voltage reduction. Nothing happens with the second set of films.

Step 3: Low Voltage Switching

Switching is done at low voltage to avoid sparking and ensure safe operation of the converter. In order to better understand how switching is accomplished, sub-steps and additional diagrams are described below. This electronic step may be done very rapidly and the thermal cycle does not have a chance to progress, which in the figures is represented by the dot on the charge versus voltage graphs and the still clock.

Figure 12:
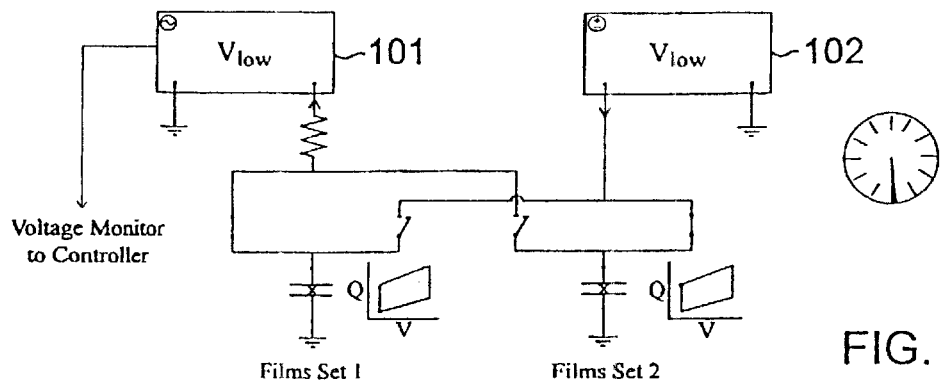

Step 3-A: Voltage Measurements (FIG. 12)

Before switching takes place, it is important to verify that the voltage of the high-voltage source 101 has had time to come down. The variable high-voltage amplifier must allow monitoring of the voltage output. When the monitored voltage is within 98% of the constant low voltage, it is considered safe to switch. Note the position of the relays before switching occurs.

Figure 13:
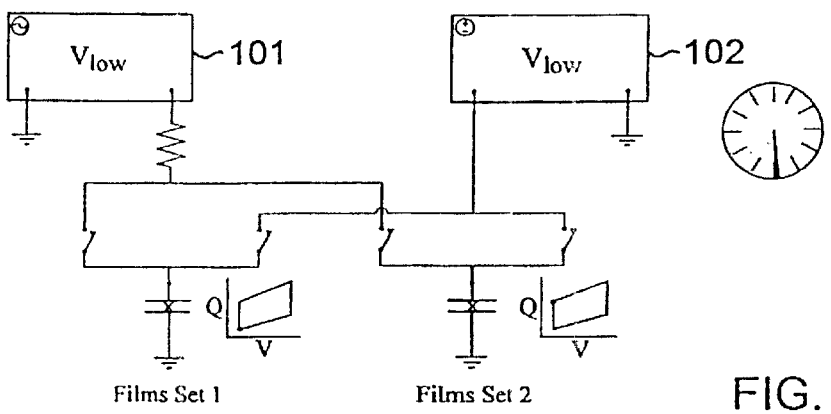

Step 3-B: Open Relays (FIG. 13)

Once the voltage is down to a safe level, it is possible to switch the two sets of films. Mercury-wetted reed relays are useful for this application. It is important to open all the relays and wait long enough to ensue that they have had time to fully open and that mercury has stopped bouncing. Typically these relays require approximately 2 to 3 ms to settle.

Figure 14:
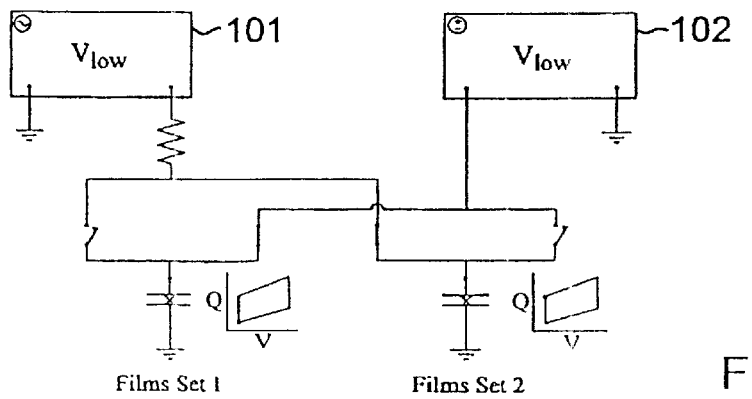

Step 3-C: Close Some Relays (FIG. 14)

After waiting for all the relays to open, it is now possible to perform the actual switching safely. Switching is done by closing some of the relays while letting the others stay open. Switching is performed at low voltage to avoid electrical sparking, thus ensuring a long life for the relays. Approximately, a 10 ms delay following the switching allows the relays to settle before the next step.

Figure 15:
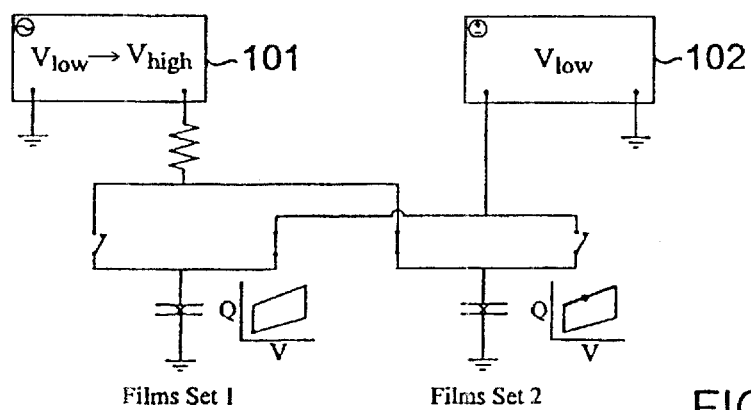

Step 4: Voltage Increase (FIG. 15)

Once the connections to the sets of films have been switched, the voltage on the second set of films is increased to high voltage. The second set of films is now fully charged and ready to generate electricity.

The first half of the cycle is now completed. The next four steps, describing the second half of the cycle, differ only from the previously described steps by the fact that the first set of films is now cooled whereas it was heated during the first half of the period and the second half of films is heated instead of being cooled.

Step 5: Cooling and Heating of Films

The first set of films is now recharged while it is cooled under low external voltage. The second set of films discharges electrical energy into a resistive load as it is heated. This step is identical to Step 1 except that the first set of films is now cooled whereas it was being heated in Step 1, and the second set of films is now heated instead of being cooled. Once again, almost half of the period is required for this step because the temperature of the films must be changed.

Step 6: Voltage Reduction

Once the temperature of the films has changed, the externally applied voltage on the heated films is reduced to allow for further discharge. This step is very rapid and similar to step 2.

Step 7: Low Voltage Switching

Step 7-A: Voltage Measurements

When the high voltage source has come down to 98% of the voltage of the constant low voltage, the circuit allows the switching to take place.

Step 7-B: Open Relays

In this step, all the switches are opened and a delay is allowed to ensure that all the relays have had time to open and that any mercury bouncing has stopped.

Step 7-C: Close Some Relays

Switching is done by closing the appropriate relays.

Step 8: Voltage Increase

The first set of films is fully recharged by increasing the externally applied voltage to $V_{high}$. The pyroelectric cycle is now completed and may be repeated.

In order to reduce conduction losses, the cycling period must be reduced as much as possible and pyroelectric copolymers with high resistivity chosen. A small degree of temperature cycling results in significant conduction losses. This is because the electrical conduction losses are constant for a given cycle period and chosen voltage but the electrical energy output of the film is directly related to the width of temperature cycling. Consequently, electrical conduction losses become a large percentage of the electrical energy output when the width of temperature cycling is small. When the width of temperature cycling of the film is reduced, eventually the conduction losses become larger than the electrical energy output depending on different parameters such as voltage, cycling period, material, etc.

Electrical losses can be reduced by increasing the resistivity of the material. This is possible by increasing the VDF content in P(VDF-TrFE). For instance, the P(VDF-TrFE) 73/27 has a resistivity that is larger than that of the 52/48. Thus, for a given cycle period and temperature cycling, the electrical losses of P(VDF-TrFE) 73/27 are smaller than these of 52/48. This is true even though the electrical energy output of the 73/27 is about 40% less than that of the 52/48 (i.e. its zero-field pyroelectric coefficient of the 73/27 is 40% smaller than that of the 52/48). It will be noted that the resistivity is very dependent on the temperature and that the Curie point of the 73/27 is about 125° C., much higher than for the 52/48, which is about 65° C. At the same temperature, the resistivity of the P(VDF-TriFE) 73/27 is very much higher (about 60 time at 60° C.) than that of 52/48.

Typical configurations of pyroelectric converters are shown in Table I, below.

TABLE 1

| Operating parameters and equipment configurations | | |
| --- | --- | --- |
| Net output (kW) | 1 | 100 |
| Hot water temperature (° C.) | 80 | 80 |
| Cold water temperature (° C.) | 30 | 30 |
| Width of temperature cycling (° C.) | 10 | 12 |
| Thickness of P(VDF-TrFE) 52/48 films ($\mu$m) | 25 | 25 |
| Width of films (m) | 0.1 | 1 |
| Length of films (m) | 2 | 4 |
| Number of films used in one stack | 12 | 10 |
| Total number of stacks | 1215 | 7334 |
| Distance between the stacks (mm) | 5 | 5 |
| Hot water flow rate (L/min) | 6 | 212 |
| Cold water flow rate (L/min) | 6 | 212 |
| Olsen cycle time (s) | 1 | 1 |
| Operating voltage: Low (V) | 1625 | 1625 |
| Operating voltage: High (V) | 250 | 250 |
| Mechanical losses (kW) | 0.023 | 34.5 |
| Electrical losses (kW) | 0.038 | 3.8 |
| Equipment dimensions | | |
| Floor area (m × m) | 1 × 1 | 4 × 5 |
| Height (m) | 1.3 | 8 |
| Total volume of pyroelectric material (m$^3$) | 0.73 | 7.9 |
| Output per volume (kW/m$^3$) | 0.77 | 0.63 |

Power losses in the fluid flow are particularly dependent on both the distance separating the plates and the volumetric flow rate. Based on power loss calculations, the best plate distance appears to lie between 3 mm and 5 mm.

Insofar as the selection of film material is concerned it has been shown that after more than 67 million electrical cycles at 60 Hz and high voltage 50 MV/m and 100° C., the electrical properties of a copolymer sample remained stable and no detectable degradation was observed. This corresponds to applying 1250 V on 25 $\mu$m pyroelectric films for more than two years at 1 Hz. The same pyroelectric film remained intact after 388 million cycles under more moderate conditions (20 and 30 MV/m and 60 Hz at room temperature) corresponding to more than 12 years of continuous use.

INDUSTRIAL APPLICABILITY

Various grades of industrial heat have been wasted to the environment because of the unfavourable economics of recovering or converting the waste heat to useful purposes by adding extra equipment. Waste heat is normally available from waste gas, process water and cooling water ranging between 25° C. and 250° C. For instance, typical thermomechanical pulp and paper mills discharge surplus energy as hot water at between 50° C. and 100° C.

Industries that emit various grades of waste heat include power plants, incineration plants, pulp mills, refineries and chemical plants. Because the pyroelectric converter of this invention uses polymer films, operating temperature is limited to below 125° C., which matches such low-grade heat sources. Incineration plants, for example, are usually built at sites away from densely populated areas; thus efficient waste heat utilization is difficult. On-site power generation using a pyroelectric converter system is a practical solution. Similarly, pulp mills are located in remote locations; thus it is difficult to make good use of waste heat without converting to electric power.

Using this invention waste heat can be converted to a high value form of energy such as electricity, helping to improve the resource utilization efficiency based on economic considerations only.

What is claimed is:

1. Apparatus for converting heat to electric energy using a pyroelectric energy converter comprising:

a plurality of thin layers of pyroelectric films arranged in a stack, means for alternatingly delivering a flow of hot and cold fluid over a surface of the pyroelectric films, said means alternating the flow of hot and cold fluids without reversing the direction of the flow such that there is rapid film temperature cycling, means coupled to said stack to apply charge to the surface of the pyroelectric films and remove charge therefrom, comprising a voltage controller having a sensing switch such that the thermal and electrical cycling of the pyroelectric energy converter are synchronized.

2. Apparatus of claim 1 wherein said sensing switch is a magnetic proximity switch.

3. Apparatus of claim 1 wherein the layers of pyroelectric films are stacked back to back such that no electrical insulation is required.

4. Apparatus of claim 1 wherein the stack comprises an even number of layers of pyroelectric films back-to-back, whereby charge applied to the surface of the outer facing pyroelectric films is low.

5. Apparatus of claim 1 further consisting of a number of stacks of pyroelectric films arranged in a first and second set, said second set comprising one less stack than the first set, means delivering hot fluid to the first stack of the first set, means flowing said fluid on to the first stack of the second set, means flowing said fluid on to the second stack of the first set, means to permit subsequent similar transfers of fluid to subsequent stacks until the fluid in the last stack of the first set flows out as a cooled fluid, means alternately delivering a cold fluid to the last stack of the first set, means flowing said fluid to the last stack of the second set; means flowing said fluid to the next to last stack of the first set, means permitting subsequent similar transfers of said fluid to subsequent stacks until the fluid in the first stack of the first set flows out as a heated fluid.

6. Apparatus according to claim 5 wherein the means for alternatingly delivering a flow of hot and cold fluids over the surface of the pyroelectric films comprises a tube connected to a first and second outlet pipes and an inlet pipe, a solid half-cylinder rotating in the tube alternatingly blocking the first or second outlet pipes such that the input pipe can be switched between the first and second outlet pipes.

7. Apparatus according to claim 6 wherein a magnetic proximity switch is attached to the solid half-cylinder, said proximity switch sending electric signals to the voltage controller to synchronize electrical and thermal cycling.

8. Apparatus according to claim 5 wherein the first and second set comprise a stage and a plurality of stages comprise a plate-type generator system wherein hot fluid input flowed from the first stack of the first set to a subsequent stage as a recycled hot fluid source and wherein the fluid flowed from the last stack of the first set is delivered to a subsequent stage as a recycled cold fluid source.

9. Apparatus according to claim 8 wherein there are two plate-type generator systems receiving alternate inputs of hot and cold fluid such that there is no interruption of flow of hot and cold fluid.

10. Apparatus according to claim 9 wherein the stacks are separate film assemblies thermally and electrically insulated from adjacent film assemblies.

11. Apparatus according to claim 10 wherein each stack has a thickness of less than 370 microns.

12. Apparatus according to claim 5 wherein each stack has a thermal response time of less than one second.

13. A method of converting heat to electric energy consisting of the steps of providing a first and second stack of a plurality of thin layers of pyroelectric films, applying an electric energy source to the first stack providing a variable high-voltage, applying in electric energy source to the second stack providing a constant low voltage, heating the first stack when at a high voltage while cooling the second stack when at a constant low voltage, thereafter reducing the voltage from the variable high voltage source, switching electrical connections of the first and second stacks when at the constant low voltage, increasing the voltage on the second stack to a high-voltage, heating the second stack at said high voltage while cooling the first stack at said constant low voltage, thereafter reducing the variable high voltage source.

14. The method of claim 13 wherein the steps are repeated, thereby creating a uniform output of electrical energy.

15. The method according to claim 13 wherein in the step of heating the first or second stack, a flow of hot or cold fluid is alternately delivered over a surface of the pyroelectric films without reversing the direction of the flow such that there is rapid film temperature cycling.

* * * * *